United States Patent
Summers et al.

(10) Patent No.: US 6,956,098 B2
(45) Date of Patent: *Oct. 18, 2005

(54) HIGH MODULUS POLYIMIDE COMPOSITIONS USEFUL AS DIELECTRIC SUBSTRATES FOR ELECTRONICS APPLICATIONS, AND METHODS RELATING THERETO

(75) Inventors: John Donald Summers, Chapel Hill, NC (US); Richard Frederich Sutton, Jr., Circleville, OH (US); Brian Carl Auman, Pickerington, OH (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 16 days.

This patent is subject to a terminal disclaimer.

(21) Appl. No.: 10/251,134

(22) Filed: Sep. 20, 2002

(65) Prior Publication Data

US 2004/0058172 A1 Mar. 25, 2004

(51) Int. Cl.$^7$ .................. C08G 73/10; C08L 79/08; B32B 27/08
(52) U.S. Cl. ............ 528/170; 528/125; 528/126; 528/128; 528/172; 528/173; 528/179; 528/183; 528/185; 528/220; 528/229; 528/350; 528/353; 428/411.1; 428/423.1; 428/457; 428/458; 428/473.5; 428/901; 427/457; 427/458; 427/487; 427/488; 427/491; 427/497; 427/535; 264/212; 264/272.11; 264/272.17; 264/299; 264/297.1; 264/297.4; 264/309; 156/233; 156/243; 156/325; 156/326; 156/330.9; 156/331.1; 156/331.3; 156/331.4; 156/331.7
(58) Field of Search .................. 528/125, 126, 528/128, 172, 170, 173, 179, 183, 185, 220, 229, 350, 353; 428/411.1, 423.1, 457–458, 473.5, 901; 427/457, 458, 487–488, 491, 497, 535; 264/212, 272.11, 272.17, 299, 297.1, 297.4, 309; 156/233, 243, 325, 326, 330.9, 331.1, 331.3, 331.4, 331.7

(56) References Cited

U.S. PATENT DOCUMENTS

| 4,451,971 | A | * | 6/1984 | Milgram .................. 438/670 |
| 4,673,612 | A |  | 6/1987 | Takagi et al. |
| 4,778,872 | A |  | 10/1988 | Sasaki et al. |
| 4,839,217 | A |  | 6/1989 | Tabata et al. |
| 5,081,229 | A |  | 1/1992 | Akahori et al. |
| 5,166,308 | A |  | 11/1992 | Kreuz et al. |
| 5,196,500 | A |  | 3/1993 | Kreuz et al. |
| 5,219,977 | A | * | 6/1993 | Kreuz .................. 528/125 |
| 5,260,408 | A | * | 11/1993 | Auman .................. 528/183 |
| 5,272,247 | A | * | 12/1993 | Sotokawa et al. .......... 528/353 |
| 5,324,475 | A | * | 6/1994 | Okahashi et al. .......... 264/555 |
| 5,543,393 | A |  | 8/1996 | Kim et al. |
| 5,693,745 | A |  | 12/1997 | Kuo et al. |
| 5,952,448 | A |  | 9/1999 | Lee et al. |
| 5,958,600 | A |  | 9/1999 | Sotokawa et al. |
| 6,201,945 | B1 |  | 3/2001 | Schlueter, Jr. et al. |
| 6,214,923 | B1 | * | 4/2001 | Goto et al. .................. 524/514 |
| 6,469,126 | B1 | * | 10/2002 | Auman et al. .............. 528/170 |
| 6,476,177 | B2 | * | 11/2002 | Auman et al. .............. 528/170 |
| 6,476,182 | B1 | * | 11/2002 | Auman et al. .............. 528/353 |
| 6,596,968 | B2 | * | 7/2003 | Yamamoto et al. .... 219/121.71 |
| 6,653,433 | B2 | * | 11/2003 | Edman et al. .............. 528/170 |
| 2002/0023906 | A1 |  | 2/2002 | Tomohiko et al. |

FOREIGN PATENT DOCUMENTS

| EP | 0130571 B1 | 10/1988 |
| EP | 0216007 B1 | 3/1991 |
| EP | 0276405 B1 | 3/1994 |
| EP | 0484161 B1 | 7/1995 |
| EP | 0353094 B1 | 10/1995 |
| EP | 0811483 A1 | 12/1997 |
| JP | 2626827 | 7/1997 |
| JP | 2722333 | 11/1997 |
| JP | 2982745 | 9/1999 |

* cited by examiner

Primary Examiner—P. Hampton Hightower

(57) ABSTRACT

The substrates of the present invention comprise a polyimide base polymer derived at least in part from collinear monomers together with crankshaft monomers. The resulting polyimide material has been found to provide advantageous properties, particularly for electronics type applications.

46 Claims, No Drawings

HIGH MODULUS POLYIMIDE COMPOSITIONS USEFUL AS DIELECTRIC SUBSTRATES FOR ELECTRONICS APPLICATIONS, AND METHODS RELATING THERETO

FIELD OF THE INVENTION

The present invention relates generally to polyimide compositions useful as dielectric materials for supporting or fixturing electronic circuits, electronic devices, or the like. Specifically, the polyimides of the present invention are synthesized (at least in part) from aromatic collinear-type monomers and aromatic crankshaft-type monomers to provide polyimides having excellent strength, processability and dimensional stability properties.

BACKGROUND OF THE INVENTION

Broadly speaking, polyimide films are known for use as base films in flexible printed circuit boards ("FPCs"). As FPC technology progresses however, certain film property improvements become increasingly desirable or necessary.

One important such film property is the rate of moisture vapor transmission. If this rate is unduly low, film processing can become difficult (if not impossible or impractical) due to unwanted surface blistering of the film, otherwise known in the industry as "popcorning".

In addition, a need also exists for polyimide films having improved strength properties, e.g., tensile modulus. Although polymer strength is often improved by stretching (orienting) a polymer above the polymer's glass transition temperature ("$T_g$"), many high performance polyimide polymers for FPC applications have a $T_g$ so close to the decomposition temperature of the polymer, that such heat-stretch orientation of the polymer film is not practical or even possible. Hence new ways for increasing strength properties are needed.

Unfortunately, as a polymer's strength properties are increased, oftentimes the polymer's rate of moisture vapor transmission will unduly decrease. Nevertheless, the FPC industry is demanding further increases in strength properties for polyimide films, while also demanding acceptable rates of moisture vapor transmission, as well as acceptable etch rates, dimensional stability and processability.

Preferred embodiments of the present invention can be manufactured in accordance with the polyimide processes and methods taught in:

U.S. Pat. No. 5,166,308, "Copolyimide Film With Improved Properties," Assigned to: E. I. Du Pont de Nemours and Company, Inventors: John A. Kreuz and Richard F. Sutton, Jr. application Ser. No. 516,887, Filed Apr. 30, 1990, Issued Nov. 24, 1992, which is hereby incorporated into this specification by reference for all teachings therein.

SUMMARY OF THE INVENTION

The polyimide film substrates of the present invention have a type of in-plane orientation along the polyimide backbone structure to provide improved strength properties without unduly diminishing the rate of moisture vapor transmission, while also providing excellent processing and dimensional stability properties. The substrates of the present invention are particularly well suited for supporting fragile metal layers having precise patterns and dimensions.

The substrates of the present invention comprise at least one film with a particular type of base polymer. "Base polymer" as used herein is intended to mean the dominant polymer component (at least 50, 55, 60, 65, 70, 75, 80, 85, 90, 95 or 100 weight percent of all polymers present in the film). Generally speaking, the base polymer will be at least 25, 30, 35, 40, 45, 50, 55, 60, 65, 70, 75, 80, 85, 90, 95 or 100 weight percent of the overall film.

The base polymer of the present invention is a polyimide synthesized by a poly-condensation reaction, involving the reaction of one or more aromatic diamine components with one or more aromatic dianhydride components.

As used herein, an "aromatic" monomer is intended to mean a monomer having at least one aromatic ring, either alone (i.e., a substituted or unsubstituted, functionalized or unfunctionalized benzene or similar-type aromatic ring) or connected to another (aromatic or aliphatic) ring. An aromatic backbone chain segment is intended to mean at least one aromatic moiety between two adjacent imide linkages.

Depending upon context, "diamine" as used herein is intended to mean: (i) the unreacted form (i.e., a diamine monomer); (ii) a partially reacted form (i.e., the portion or portions of an oligomer or other polyimide precursor derived from or otherwise attributable to diamine monomer) or (iii) a fully reacted form (the portion or portions of the polyimide derived from or otherwise attributable to diamine monomer). The diamine can be functionalized with one or more moieties, depending upon the particular embodiment selected in the practice of the present invention.

Indeed, the term "diamine" is not intended to be limiting (or interpreted literally) as to the number of amine moieties in the diamine component. For example, (ii) and (iii) above include polymeric materials that may have two, one, or zero amine moieties. Alternatively, the diamine may be functionalized with additional amine moieties (in addition to the amine moieties at the ends of the monomer that react with dianhydride to propagate a polymeric chain). Such additional amine moieties could be used to crosslink the polymer or to provide other functionality to the polymer.

Similarly, the dianhydride as used herein is intended to mean the component that reacts with (is complimentary to) the diamine and in combination is capable of reacting to form an intermediate polyamic acid (which can then be cured into a polyimide). Depending upon context, "anhydride" as used herein can mean not only an anhydride moiety per se, but also a precursor to an anhydride moiety, such as: (i) a pair of carboxylic acid groups (which can be converted to anhydride by a de-watering or similar-type reaction); or (ii) an acid halide (e.g., chloride) ester functionality (or any other functionality presently known or developed in the future which is) capable of conversion to anhydride functionality.

Depending upon context, "dianhydride" can mean: (i) the unreacted form (i.e. a dianhydride monomer, whether the anhydride functionality is in a true anhydride form or a precursor anhydride form, as discussed in the prior above paragraph); (ii) a partially reacted form (i.e., the portion or portions of an oligomer or other partially reacted or precursor polyimide composition reacted from or otherwise attributable to dianhydride monomer) or (iii) a fully reacted form (the portion or portions of the polyimide derived from or otherwise attributable to dianhydride monomer).

The dianhydride can be functionalized with one or more moieties, depending upon the particular embodiment selected in the practice of the present invention. Indeed, the term "dianhydride" is not intended to be limiting (or interpreted literally) as to the number of anhydride moieties in the dianhydride component. For example, (i), (ii) and (iii) (in the paragraph above) include organic substances that may have two, one, or zero anhydride moieties, depending upon whether the anhydride is in a precursor state or a reacted state. Alternatively the dianhydride component may be functionalized with additional anhydride type moieties (in addition to the anhydride moieties that react with diamine to provide a polyimide). Such additional anhydride moieties could be used to crosslink the polymer or to provide other functionality to the polymer.

In polyimide synthesis, each polymerized monomer (when polymerized into a polyimide backbone between two other monomers) will generally form nitrogen-benzene imide linkages (on each side of the polymerized monomer). For the aromatic polyimides of the present invention these nitrogen-benzene linkage pairs will be either: (i) collinear anti-parallel; (ii) crankshaft anti-parallel; or (iii) non-anti-parallel.

"Anti-parallel" is intended to mean parallel but oriented in opposite directions. "Anti-parallel" is also intended to mean "substantially" anti-parallel whereby the imputed angle formed by the two nitrogen-benzene bonds (for the polyimide) or the two C—N bonds (of amine end groups of the diamine monomer) is about 180°± up to 5, 10, 15, 20, 25 or 30°.

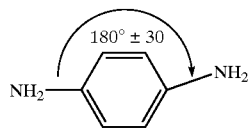

Polyimide backbone configurations are difficult, if not impossible to fully verify, and therefore for purposes of this invention, the polyimide backbone configuration is defined primarily (and preferably, solely) by the type of monomers used in creating the polyimide.

The polyimides of the present invention are synthesized by polymerizing: (i) aromatic crankshaft type monomers; (ii) aromatic collinear monomers; and (iii) optionally up to 0, 0.5, 1, 2, 5, 10, 15, 20, 25, or 30 moles of other monomers (per 100 moles of total monomer).

"Collinear monomer" is intended to mean a polyimide monomer having a dominant rod-like conformation, at least when polymerized into a substantially rod-like (e.g., linear and rigid) polymer chain segment or a matrix of substantially rod-like polymer chain segments. Hence, the collinear monomer will have reactive ends (used to link the monomer into a polymeric backbone structure upon polymerization) are anti-parallel and substantially linear. Presumably, collinear monomers (when polymerized between two other monomers) form a pair of collinear, anti-parallel nitrogen-benzene imide linkages on each side of the polymerized monomer. Examples of collinear monomers include p-phenylenediamine and pyromellitic dianhydride.

A "crankshaft monomer" has reactive ends that are also anti-parallel, but in contra-distinction to collinear monomers (where the ends are not offset), the reactive ends of the crankshaft monomer are also "offset".

For purposes of the present invention, crankshaft monomers have or form "ends" that are offset and anti-parallel. When the monomer is incorporated into a polyimide polymer, these "ends" are typically nitrogen-benzene linkages (or substituted derivations thereof) at adjacent imide (or imide-like) moieties along a polyimide polymer. In monomer form, the crankshaft monomer ends typically form a crankshaft conformation via the C—N bonds at the reactive ends of the monomer (the reactive ends that are used to propagate a polymeric chain). In a crankshaft conformation, a typical geometric shape of the crankshaft monomer with respect to the end groups is illustrated below.

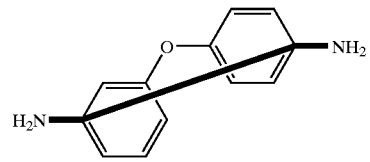

However, there are two general types of crankshaft monomers. The first type is a crankshaft monomer having a non-rigid backbone, where one or more bonds along the backbone can be an axis of rotation, thereby allowing non-crankshaft conformations. The above crankshaft illustration also illustrates a non-rigid crankshaft, because the backbone can rotate around the meta C—O bond axis to create non-crankshaft conformations. Such (possible) rotation around an interior bond along the backbone to form non-crankshaft conformations defines a crankshaft (whether in a monomeric or polymeric form) as being "non-rigid," at least for purposes of the present invention. Although non-rigid crankshaft monomers have non-crankshaft conformations, they are still considered to be crankshaft monomers for purposes of the present invention.

The second type of crankshaft monomers have a rigid backbone with substantially only one conformation (a crankshaft conformation), where the anti-parallel ends are aligned along parallel lines but the lines are offset. Monomers substantially without rotational freedom along their backbone to form non-crankshaft conformations define the crankshaft (whether in a monomeric or polymeric form) as "rigid", at least for purposes of the present invention.

In either type of crankshaft (rigid or non-rigid), the crankshaft conformation provides an anti-parallel offset that is theoretically at least one fourth, fifth, sixth, seventh or eighth of the average bond length between the two crankshaft ends. While the offset distance can perhaps (at least theoretically) be calculated somewhat precisely for a particularly crankshaft monomer, these distances are believed to change (or be significantly affected) after the monomer is polymerized into a polyamic acid or a polyimide, due to sterric and other interactions between the crankshaft along the polymer chain and the surrounding polymeric matrix.

Hence a precise offset distance for any particular crankshaft along any particular polymer chain within any particular polyimide or polymeric matrix, would be very difficult, perhaps impossible (and certainly impractical) to calculate or predict. Indeed, for purposes of the present invention, it is only critical that certain amounts of certain types of crankshaft monomers be used when polymerizing the polyimides of the present invention. Whether or not crankshafts are actually formed along the resulting polymer chains of the present invention is not critical to the present invention.

Indeed, it may be (theoretically) possible that surrounding rod-like polymer segments may force a crankshaft segment into more of a rod-like configuration and these forces or interactions (rather than any actual crankshaft configuration) may provide many or all of the advantages of the present invention. Hence, the crankshaft monomers of the present invention certainly provide unexpected advantages, but it is not a critical aspect of the present invention that these monomers form any particular backbone configuration—crankshaft, pseudo-crankshaft or otherwise.

Examples of possible crankshaft monomers include any diamine and any dianhydride where the monomer ends are linked along a backbone having two separate aromatic rings (typically a benzene ring, whether substituted, unsubstituted, functionalized or unfunctionalized, and whether it is a single ring, fused with another ring or otherwise) where the benzene rings are the same or different and where the benzene rings are either: (i) fused, (ii) connected by a single bond between carbons of the benzene rings or (iii) connected by a bridging group.

Useful bridging groups include —O—, —N(H)—C(O)—, —S—, —SO$_2$—, —C(O)—, —C(O)O—, —C(CH$_3$)$_2$—, —C(CF$_3$)$_2$—, —C(R, R')— where R and R' are the same or different and are any organic group capable of bonding to a carbon, or the like. Depending upon the structure, the amines may be ortho, meta or para to the bridging group connection. Due to steric hindrance, the diamines with one in the meta- and one in the para- position are generally preferred.

Such crankshaft monomers having no bridging group between aromatic rings (the rings are fused) or having a single carbon-carbon bond between aromatic rings are deemed "rigid" crankshaft monomers, at least for purposes of the present invention. Such crankshaft monomers having a bridging group that provides at least one element between two aromatic rings are deemed "non-rigid," at least for purposes of the present invention.

While not intending to be bound by any particular theory, often the crankshaft conformation of any given crankshaft monomer defines a lower thermodynamic energy state than most, if not all, non-crankshaft conformations. Therefore it seems possible, if not probable, that the crankshaft monomers of the present invention preferentially form crankshaft backbone segments along the polyimide polymer and that such crankshafts are perhaps compressed into a somewhat rod-like configuration, due to the rigid, rod-like polymer segments connected to or surrounding the crankshaft segment.

However polyimide backbone configurations are difficult, perhaps impossible, to fully and precisely measure. So, it is not a requirement of the present invention that any particular polyimide backbone configuration, or conformation, be obtained or verified. Rather, the present invention recognizes that crankshaft monomers and collinear monomers (optionally also a small mole percent of other monomers) can be combined in accordance with the present invention to provide a polyimide polymer having unexpected and advantageous properties, particularly for electronics type applications.

The collinear and crankshaft monomers of the present invention each tend to contribute a different type of in-plane orientation. While not intended to be held to (or limited by) any particular theory concerning the present invention, it is theorized that during polymerization, film formation, and/or imidization:

i. the collinear monomers contribute to rigidity and in-plane orientation with a packing of the polymer chains within the same plane, (the resulting densely packed, in-plane oriented polymer segments are believed to provide improved strength properties, e.g., modulus, to the polymer matrix);

ii. the crankshaft monomer presumably (or preferentially) assumes a crankshaft conformation during the polymer processing (e.g., during amide polymerization or subsequently during film formation or imidization) to provide (or contribute to) high in-plane orientation (and hence improved strength properties), whereby the (presumed) offset along the polymer backbone segment diminishes the packing density of the polymer (and adds a degree of freedom along the polymer chain) and this presumably aids water (or solvent) vapor transmission and allows the in-plane polymer matrix to be more receptive to the crossing and inter-weaving of other polymer chains;

iii. the crankshaft monomer (if it assumes a less preferred non-crankshaft conformation) causes a change in direction of the polymer chain, thereby allowing or creating polymer segments with high rigidity to polymerize along different directions and disrupting (at least to some extent) the otherwise highly rod-like nature of the polymer matrix (this would then indicate a lowering of the packing density and/or in-plane orientation, of the polymeric material which in turn might explain the improved (increased) moisture vapor transmission properties; and iv. the property changes caused by crankshaft dianhydrides can be quite different from property changes due to otherwise similar crankshaft diamines, because the portion of the imide linkage contributed by each anhydride is generally more rigid (or is otherwise quite different chemically) than what is contributed (to the imide linkage) by the amines of the diamine, and therefore the crankshaft monomers of the present invention are further defined according to whether the crankshaft monomer is a diamine or a dianhydride (it is theorized that the diamine crankshaft monomers, particularly non-rigid diamine crankshaft monomers, may be more useful for improving moisture vapor transmission relative to dianhydrides and that dianhydride crankshaft monomers may be more useful for improving strength properties relative to diamine crankshaft monomers, at least in some embodiments of the present invention).

The polyimide polymers of the present invention are derived from one or more precursors formed from monomers that are collectively used to create the polymers of the present invention. The monomers comprise: (i) aromatic crankshaft diamine and aromatic collinear diamine in a mole ratio from about 60–95:5–40, (ii) aromatic crankshaft dianhydride and aromatic collinear dianhydride in a mole ratio from 5–35:65–95, and (iii) at least in one embodiment, a mole ratio of non-rigid crankshaft monomer to rigid crankshaft monomer is A:B, where A is a range from 50, 55, 60, 65, 70, 75, or 80, to about 80, 85, 90, 92, 94, 95, 96, 97, 98, 99 or 100, and B is a range from 0, 1, 2, 3, 4, 5, 6, 8, 10, 15, or 30 to about 20, 25, 30, 25, 40, 45 or 50. In one embodiment, the monomer composition(s) are subjected to curing conditions until a tensile modulus greater than 700, 725, 750, 775, 800, 825, or 850 kpsi (at 20° C.) is obtained.

Ordinary skill and experimentation may be necessary in preparing the polyimide films of the present invention, depending upon the particular monomers selected and the particular polyimide film manufacturing process selected in the practice of the present invention.

In one embodiment, the films of the present invention further comprise one or more of the following properties:

A. a transmission rate of water vapor (at 20° C.) greater than about 0.3, 0.35, 04, 0.45, 0.5, 0.55, 0.6, 0.65, or 0.7 gram-mm/(m$^2$-day);

B. a coefficient of linear thermal expansion (measured between 50° C. and 250° C.) of from about 5, 7, 9, 10, 12, 15, or 17 ppm/° C. to about 17, 19, 20, 22, 24, or 25 ppm/° C.;

C. a water absorption of less than or equal to 3.0% 2.8%, 2.5%, 2.3% or 2.0%;
D. an etch rate greater than 0.1, 0.15, 0.2, 0.25, 0.3, 0.35, or 0.4 mils/min;
E. a glass transition temperature above 300, 330, 350, 360, 370, 380, 385, 390, 395, or 400° C.;
F. a modulus from 800–1200 kpsi; and
G. a coefficient of moisture-absorption expansion of less than or equal to 20, 19, 18, 17, or 16 ppm per % RH.

It would be impossible to discuss or describe all possible polyimide film manufacturing processes useful in the practice of the present invention. It should be appreciated that the monomer systems of the present invention are capable of providing the above-described advantageous film properties in a variety of manufacturing processes. The films of the present invention can be manufactured as described herein and can be readily manufactured in any one of many (perhaps countless) ways of those film manufacturers ordinarily skilled in the art using any conventional polyimide film manufacturing technology.

DETAILED DESCRIPTION OF THE PREFERED EMBODIMENTS

The preferred polyimide films of the present invention are preferably derived from the reaction product of at least four monomers.

The preferred monomers for the preferred embodiment are defined as follows:

Monomer I ("Crankshaft-type" Diamine)

Monomer I: a crankshaft-type diamine monomer, such as 3,4'-oxydianiline ("3,4'-ODA") or a functional derivative thereof. Such a diamine monomer can be illustrated as follows:

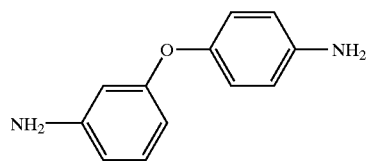

3,4'-ODA (crankshaft conformation)

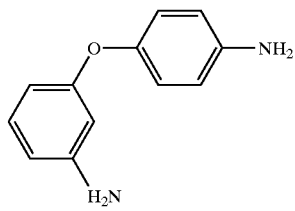

(I)

3,4'-ODA (non-crankshaft conformation)

3,4'-oxydianiline ("3,4'-ODA") is also sometimes referred to as 3,4'-diaminodiphenyl ether ("3,4'-DADE").

Other examples of possible crankshaft monomers include any diamine where an amine is attached to each of two separate benzene rings (whether the benzene ring is substituted, unsubstituted, functionalized or unfunctionalized, and whether it is a single ring, fused with another ring or otherwise), where the benzene rings are the same or different and where the benzene rings are either: (i) fused, (ii) connected by a single bond between carbons of the benzene rings or (iii) connected by a bridging group.

Useful bridging groups include —O—, —N(H)—C(O)—, —S—, —SO$_2$—, —C(O)—, —C(O)O—, —C(CH$_3$)$_2$—, —C(CF$_3$)$_2$—, —C(R,R')— where R and R' are the same or different and are any organic group capable of bonding to a carbon, or the like. Depending upon the structure, the amines may be ortho, meta or para to the bridging group connection. Due to sterric hindrance, the meta and para positions are generally preferred. Other examples of crankshaft diamines are ester-containing diamines represented by the following:

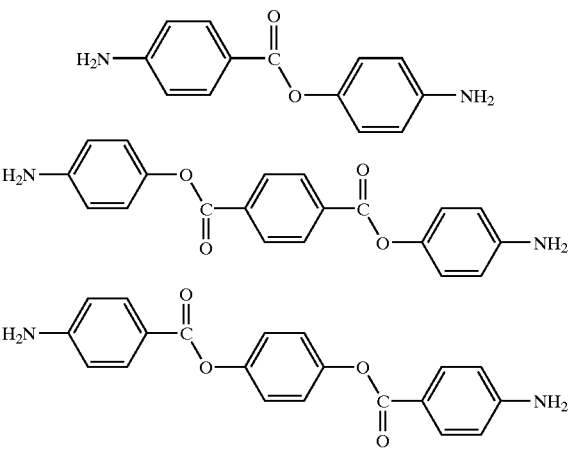

Monomer II (Collinear-type Diamine)

Monomer II: a collinear-type diamine, such as p-phenylene diamine (also referred to as "PPD") or a functional derivative thereof. Such a diamine monomer can be illustrated as follows:

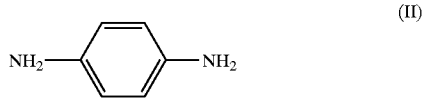

(II)

Monomer III (Crankshaft Dianhydride Monomer)

Monomer III: a crankshaft dianhydride component, such as 3,3'4,4'-biphenyltetracarboxylic dianhydride ("BPDA") or a functional derivative thereof. Such a dianhydride monomer can be illustrated as follows:

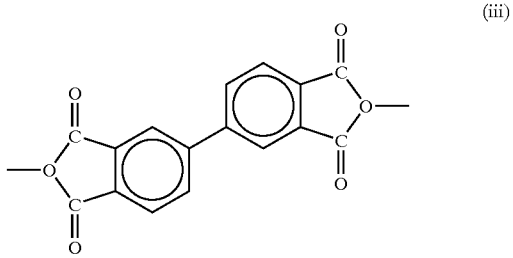

(iii)

"crank-shaft" conformation

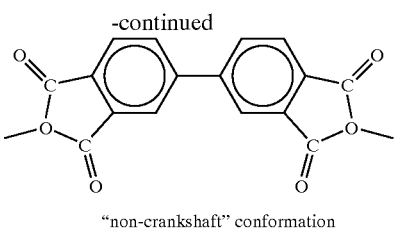

"non-crankshaft" conformation

Other examples include functional derivatives of 3,3',4,4'-biphenyltetracarboxylic dianhydride like a dicarboxylic acid, and lower alcohol esters of the acids.

As with crankshaft diamines (discussed above regarding Monomer I above), other examples of possible crankshaft dianhydrides include dianhydrides having a bridging group between two aromatic moieties. Useful such bridging groups may include —O—, —N(H)—C(O)—, —S—, —SO$_2$—, —C(O)—, —C(O)O—, —C(CH$_3$)$_2$—, —C(CF$_3$)$_2$—, —C(R,R')— where R and R' are the same or different and are any organic group capable of bonding to a carbon, or the like. Crankshaft dianhydrides are also possible using a naphthalene based backbone between the anhydride moieties.

Monomer IV (Collinear Dianhydride)

Monomer IV: a collinear dianhydride component, such as pyromellitic dianhydride ("PMDA") or a functional derivative thereof. PMDA can be represented by the following structure:

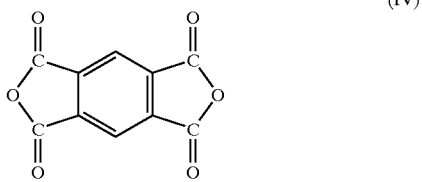

(IV)

Preferred examples of pyromellitic dianhydride or its carboxylic diacid, and its functional derivatives, including acid halide esters and lower alcohol esters thereof. PMDA is preferred.

Other Co-monomers

Additional co-monomers can optionally be used in synthesizing the preferred polyimide polymers of the present invention, provided that the additional co-monomers are less than 30, 25, 20, 15, 10, 5, 2, 1 or 0.5 mole percent of the final polyimide polymer. To the extent the below monomers do not otherwise fit within one of the definitions for monomers I, II, III or IV, outlined above, any of the following are examples that may be used as an additional co-monomer for embodiments of the present invention:

1. 2,3,6,7-naphthalene tetracarboxylic dianhydride;
2. 1,2,5,6-naphthalene tetracarboxylic dianhydride;
3. benzidine;
4. substituted benzidine (e.g., 2,2'-bis (trifluoromethylbenzidine)
5. 2,3,3',4'-biphenyl tetracarboxylic dianhydride;
6. 2,2',3,3'-biphenyl tetracarboxylic dianhydride;
7. 3,3',4,4'-benzophenone tetracarboxylic dianhydride;
8. 2,3,3',4'-benzophenone tetracarboxylic dianhydride;
9. 2,2',3,3'-benzophenone tetracarboxylic dianhydride;
10. 2,2-bis(3,4-dicarboxyphenyl) propane dianhydride;
11. bis(3,4-dicarboxyphenyl) sulfone dianhydride;
12. 1,1-bis(2,3-dicarboxyphenyl) ethane dianhydride;
13. 1,1-bis(3,4-dicarboxyphenyl) ethane dianhydride;
14. bis(2,3-dicarboxyphenyl) methane dianhydride;
15. bis(3,4-dicarboxyphenyl) methane dianhydride;
16. 4,4'-(hexafluoroisopropylidene) diphthalic anhydride
17. oxydiphthalic dianhydride;
18. bis(3,4-dicarboxyphenyl) sulfone dianhydride;
19. bis(3,4-dicarboxyphenyl) sulfoxide dianhydride;
20. thiodiphthalic dianhydride;
21. 2,2 bis-(4-aminophenyl) propane;
22. 4,4'-diamino diphenyl methane;
23. 4,4'-diamino diphenyl sulfide;
24. 3,3'-diamino diphenyl sulfone;
25. 4,4'-diamino diphenyl sulfone;
26. 4,4'-diamino diphenyl ether;
27. 1,5-diamino naphthalene;
28. 4,4'-diamino-diphenyl diethylsilane;
29. 4,4'-diamino diphenylsilane;
30. 4,4'-diamino diphenyl ethyl phosphine oxide;
31. 4,4'-diamino diphenyl N-methyl amine;
32. 4,4'-diamino diphenyl-N-phenyl amine;
33. 1,3-diaminobenzene;
34. 1,2-diaminobenzene;
35. 2,2-bis(4-aminophenyl) 1,1,1,3,3,3-hexafluoropropane;
36. 2,2-bis(3-aminophenyl) 1,1,1,3,3,3-hexafluoropropane;
37. and the like.

Molar Ratios

The first monomer (Monomer I), represented by the general formula (I) above, is preferably used in an amount from about 60, 62.5, 65, 67.5, 70, 72.5, 75, 77.5, or 79 mole % to about 80, 82, 84, 85, 86, 88, 90, 92 or 95 mole % (based upon total moles of diamine components in the polyimide polymer), and in an amount of from about 70 or 75 to about 79 or 85 mole % for the preferred embodiment.

The second monomer (Monomer II) represented by the general formula (II) above is preferably used in an amount necessary to provide from about 5, 8, 10, 12, 14, 15, 16, 18, or 20 mole % to about 20, 21, 22, 25, 27, 30, 32.5, 35, 38.5 or 40 mole % (based upon total moles of diamine component incorporated into the final polyimide polymer), and more preferred in an amount of about 15–25 mole percent in one embodiment.

The third monomer (Monomer III) represented by the general formula (III) above is preferably used in an amount necessary to provide from about 5, 6, 7, 8, 9, or 10 mole % to about 10, 11, 12, 13, 14, 15, 16, 17, 18, 19, or 20 mole % to about 22, 24, 26, 28, 30, 32, 34, and 35 mole % (based upon total dianhydride component incorporated into the final polyimide polymer), and more preferred in an amount of about 8–15 mole percent for one embodiment.

The fourth monomer (Monomer IV) represented by the general formula (IV) above is preferably used in an amount necessary to provide from about 65, 66, 68, 70, 72, 74, 76, 78, 80, 81, 82, 83, 84, 85 mole % to about 86, 87, 88, 89, 90, 91, 92, 93, 94, or 95 mole % (based upon total dianhydride component incorporated into the final polyimide polymer), and more preferred in an amount of about 85–92 mole % for one embodiment.

The polyimide film according to the present invention can be produced by combining the above monomers together with a solvent to form a polyamic acid (also called a polyamide) solution.

The dianhydride and diamine components are typically combined in a molar ratio of aromatic dianhydride component to aromatic diamine component of from 0.90 to 1.10. Molecular weight can be adjusted by adjusting the molar ratio of the dianhydride and diamine components.

The polyamic acid casting solution is derived from the polyamic acid solution. The polyamic acid casting solution preferably comprises the polyamic acid solution combined with conversion chemicals like: (i) one or more dehydrating agents, such as, aliphatic acid anhydrides (acetic anhydride, etc.) and aromatic acid anhydrides; and (ii) one or more catalysts, such as, aliphatic tertiary amines (triethylamine, etc.), aromatic tertiary amines (dimethylaniline, etc) and heterocyclic tertiary amines (pyridine, picoline, isoquinoilne, etc). The anhydride dehydrating material it is often used in a slight molar excess of the amount of amide acid groups in the copolyamic acid. The amount of acetic anhydride used is typically about 2.0–3.0 moles per equivalent of copolyamic acid. Generally, a comparable amount of tertiary amine catalyst is used.

In one embodiment, the polyamic acid solution and/or the polyamic acid casting solution are dissolved in an organic solvent at a concentration from about 5, 10 or 12% to about 12, 15, 20, 25, 27, 30 or from about 40, 45, 50, 55, 60, 65, 70, 75, 80, 85, or 90% by weight. Examples of suitable solvents include: sulfoxide solvents (dimethyl sulfoxide, diethyl sulfoxide, etc.), formamide solvents (N,N-dimethylformamide, N,N-diethylformamide, etc.), acetamide solvents (N,N-dimethylacetamide, N,N-diethylacetamide, etc.), pyrrolidone solvents (N-methyl-2-pyrrolidone, N-vinyl-2-pyrrolidone, etc.), phenol solvents (phenol, o-, m- or p-cresol, xylenol, halogenated phenols, catechol, etc.), hexamethylphosphoramide and gamma-butyrolactone. It is desirable to use one of these solvents or mixtures thereof. It is also possible to use combinations of these solvents with aromatic hydrocarbons such as xylene and toluene, or ether containing solvents like diglyme, propylene glycol methyl ether, propylene glycol, methyl ether acetate, tetrahydrofuran, and the like.

The polyamic acid (and casting solution) can further comprise any one of a number of additives, such as processing aids (e.g., oligomers), antioxidants, light stabilizers, flame retardant additives, anti-static agents, heat stabilizers, ultraviolet absorbing agents, inorganic fillers or various reinforcing agents.

The solvated mixture (the polyamic acid casting solution) can then be cast or applied onto a support, such as an endless belt or rotating drum, to give a film. Next, the solvent containing-film can be converted into a self-supporting film by baking at an appropriate temperature (thermal curing) together with conversion chemical reactants (chemical curing). The film can then be separated from the support, oriented such as by tentering, with continued thermal and chemical curing to provide a polyimide film.

Useful methods for producing polyimide film in accordance with the present invention can be found in U.S. Pat. No. 5,166,308 which has been incorporate by reference into this specification for all teachings therein. Numerous variations are also possible, such as: (a) a method wherein the diamine components and dianhydride components are preliminarily mixed together and then the mixture is added in portions to a solvent while stirring, (b) a method wherein a solvent is added to a stirring mixture of diamine and dianhydride components (contrary to (a) above), (c) a method wherein diamines are exclusively dissolved in a solvent and then dianhydrides are added thereto at such a ratio as allowing to control the reaction rate, (d) a method wherein the dianhydride components are exclusively dissolved in a solvent and then amine components are added thereto at such a ratio to allow control of the reaction rate, (e) a method wherein the diamine components and the dianhydride components are separately dissolved in solvents and then these solutions are mixed in a reactor, (f) a method wherein the polyamic acid with excessive amine component and another polyamic acid with excessive dianhydride component are preliminarily formed and then reacted with each other in a reactor, particularly in such a way as to create a non-random or block copolymer, (g) a method wherein a specific portion of the amine components and the dianhydride components are first reacted and then the residual diamine components are reacted, or vice versa, (h) a method wherein the conversion chemicals are mixed with the polyamic acid to form a polyamic acid casting solution and then cast to form a gel film, (i) a method wherein the components are added in part or in whole in any order to either part or whole of the solvent, also where part or all of any component can be added as a solution in part or all of the solvent, (j) a method of first reacting one of the dianhydride components with one of the diamine components giving a first polyamic acid. Then reacting the other dianhydride component with the other amine component to give a second polyamic acid. Then combining the amic acids in any one of a number of ways prior to film formation.

The thickness of the polyimide film may be adjusted depending on the intended purpose of the film or final application specifications. It is generally preferred that the thickness of the film ranges from 2, 3, 5, 7, 8, 10, 12, 15, 20, or 25 microns to about 25, 30, 35, 40, 45, 50, 60, 80, 100, 125, 150, 175, 200, 300, 400 or 500 microns. Preferably, the thickness is from about 8 to about 125 microns.

In the films of the present invention, when the amount of biphenyltetracarboxylic dianhydride acid (or its carboxylic acid counterpart) is below about 2, 3, 4, or sometimes 5 mol % (depending upon the particular embodiment selected), the resultant film can have an increase in both coefficient of humidity expansion ("CHE") and water absorption factor, which may be undesirable depending upon the intended application. As the amount of biphenyltetracarboxylic dianhydride (or BPDA) is increased at a given diamine ratio, etchability of the co-polyimide film can decrease, depending upon the particular embodiment selected. As the amount of 3,4'-ODA is increased at a constant dianhydride ratio, then the film will generally provide a higher thermal expansion coefficient (CTE) and a lower modulus of elasticity.

Polyimide films according to the present invention can be used as a base film for a laminate for incorporation into a flexible printed circuit board ("FPC"). In one embodiment, a flexible printed circuit board ("FPC") can be produced as follows:

1. applying an adhesive (onto the polyimide film of the present invention) and drying;
2. laminating a copper or other conductive foil;
3. hardening the adhesive; and
4. forming a circuit pattern (broadly speaking: application of a resist, photo-patterning and development of the resist, copper etching and removal of the resist).

Examples of adhesives useful in forming the adhesive layer include thermoplastic polyimide resins, epoxy resins, phenolic resins, melamine resins, acrylic resins, cyanate resins and combinations thereof. In one embodiment, the adhesive is a polyimide thermoplastic resin, optionally further comprising a thermosetting adhesive, such as, epoxy resin and/or phenolic resin. For adhesives having both thermoplastic and thermosetting components, the content of the thermosetting resin in the adhesive layer generally ranges from 5 to 400 parts by weight, preferably from 50 to 200 parts by weight, per 100 parts by weight of resin components other than the thermosetting resin.

In alternative embodiments, the adhesive is omitted. The adhesive may be omitted by casting polyamic acid solution onto a metal substrate, and thereafter drying and curing the polyamic acid solution to create the polyimide film. Alternatively: i. a polyimide film of the present invention can be sputtered with a metal; or ii. the metal and polymer layers can be bonded together by heat and pressure.

The FPC should have high dimensional stability, and this can be obtained with the polyimide films of the present invention, due in particular to the advantageously high modulus and excellent match of coefficient of linear thermal expansion to copper and other conductive materials.

The adhesion strength of the above-described laminates can be improved by employing various techniques for elevating adhesion strength. For example, prior to the step of applying the adhesive onto the polyimide film or laminating an adhesive sheet thereon, the polyimide film can be subjected to a pre-treatment step (heat treatment, corona treatment, plasma treatment under atmospheric pressure, plasma treatment under reduced pressure, treatment with coupling agents (like polyamic acids oligomers and silanes), sandblasting, alkali-treatment, acid-treatment, etc.). To improve the adhesion strength, it is generally also possible to add various metal compounds as disclosed, for example, in U.S. Pat. No. 4,742,099 incorporated herein by reference, (tin compounds, titanium compounds, etc.) to the polyamide acid or to apply various metal compound solutions onto the gel film.

The above-described heat treatment can be employed as the pretreatment of the polyimide film and can be continuously performed by using, for example, a heat treatment system provided with a heating oven (an electric heater, etc.) between a film feeder and a dispenser. It is preferable to use a heating system, having a plurality of heating ovens, if necessary. It is also generally preferable that the maximum heating temperature is controlled so as to give the maximum ambient temperature of the heating ovens of from 200 to 600° C. still more preferably from 250 to 550° C.

By regulating the maximum heating temperature within the range as defined above, it is generally possible to obtain a polyimide film that has excellent mechanical strength, adhesive strength, and dimensional stability. Regarding the heat treatment time, it is preferable that the polyimide film is exposed to the maximum heating temperature in a range from about 1, 2, 3, 5, 10, 15, 20, 25, 30, 35, 40, 45 or 50 seconds to about 60, 70, 80, 90, 100, 200, 400, 500, 700, 800, 900, 1000, 1100 or 1200 seconds. In the heat treatment, the heating temperature may be changed stepwise. For example, the temperatures of heating ovens can be set respectively to 200, 300, 400, 300 and 200° C. and the polyimide film can be exposed to the temperature of each oven for about 200 seconds. Alternatively, the heating temperatures of the heating ovens can generally be set to ramp up to a temperature, such as 350, 375, 400, 425, 450, 475, or 500° C. or more, while varying the heating time from oven to oven.

Corona treatment can be employed as the pretreatment of the polyimide film and may be performed by using a corona treatment system commonly available for those skilled in the art.

Plasma treatment can be employed as the pretreatment of the polyimide film and may be performed by using a plasma treatment system commonly available for those skilled in the art.

A coupling agent can be used as a pretreatment of the polyimide film, preferably at the gel or partially cured stage. It may be performed by for example applying a coupling agent solution on the surface of the film, lapping the surface of the film with a coupling agent solution, spraying a coupling agent solution onto the surface of the film, immersing the film in a coupling agent solution. The coupling agent can be any of the following types or classes: silane-based, titanium-based, aluminum-based, zirconium-based, aliphatic polyamine-based, aromatic polyamine-based, etc. Among the aromatic polyamine-based coupling agents, it is often preferable to use diethylenetriamine, N-aminoethylpiperazine or isophronediamine. It is often preferable to adjust the concentration of the coupling solution to 0.005 to 50% by weight. More preferably 0.1 to 20% by weight and still preferably 1 to 10% by weight so that the coupling agent can be uniformly adhered onto the film surface and can fully exert its effect. The organic solvent to be used in the preparation of the coupling agent solution is not particularly restricted, and examples include methanol, ethanol, propanol, butanol, N,N-dimethylformamide, N,N-dimethylacetamide, N-methyl-2-pyrrolidone, etc. or mixtures thereof.

The polyimide films according to the present invention can also be used as a base film of an adhesive film laminate for use in high density packaging materials, such as, chip scale semiconductor packages, and the like. The polyimide films of the present invention have excellent dielectric properties, solder heat resistance, dimensional stability and adhesion characteristics.

The films of the present invention can be used as a base film for fixing or insulating electronic parts, electronic circuit boards, and in electronic equipment. The films of the present invention are particularly useful for die pad bonding of flexible print connection boards or semiconductor devices or packaging materials for CSP (chip scale package), chip on flex (COF), COL (chip on lead), LOC (lead on chip), multi-chip module ("MCM"), ball grid array ("BGA") or micro-ball grid array ("$\mu$BGA"), and/or tape automated bonding ("TAB").

In another embodiment, the films or substrates of the present invention are used for wafer level integrated circuit packaging, where a composite is made comprising a substrate according to the present invention interposed between a conductive layer having a thickness of less than 100 microns, and a wafer comprising a plurality of integrated circuit dies. Optionally, an adhesive layer can be used to bond the conductive layer to the polyimide substrate of the present invention. In one (wafer level integrated circuit packaging) embodiment, the conductive passageway is connected to the dies by a conductive passageway, such as a wire bond, a conductive metal, a solder bump or the like.

The high performance films and substrates of the present invention are also well suited for high performance semiconductor devices, such as devices based upon semiconductor materials having improved properties over conventional doped silicon, such as gallium arsenide or other compounds of two or more elements, such as those formed from Group IIIA and Group VA elements of the periodic table or compounds from Groups IIA and VIA of the periodic table. The films and substrates of the present invention are well suited for semiconductor materials that provide (relative to doped silicon) improved electron mobility, reduced parasitic capacitance and signal loss, improved device isolation (due to increased resistively) and improved resiliency to harsh environments.

A polyimide film according to the present invention can be used as a base film having adhesive layer(s) on one or both faces of the polyimide film. The adhesive can be a thermoplastic polyimide adhesive, a thermosetting adhesive (such as an epoxy, phenolic, melamine, xylene or cyanate) or a combination thereof. The adhesive layer may be formed on the polyimide film (of the present invention) in the same manner as in the above-described case of producing a laminate for FPCs. However, the present invention is not restricted to these constructions. Namely, a solution of a thermoplastic polyimide or a solution of a polyamic acid (i.e., a precursor to imide formation) may be cast onto the polyimide film or applied thereon with a roll coater, a bar coater, etc. followed by drying by heating, thereby forming an adhesive layer. Alternatively, a thermoplastic polyimide in the form of a film or a powder can be heat compression bonded to the polyimide film by using, for example, a double belt press machine provided with a heating/pressing member and an endless belt, thereby forming an adhesive layer.

The present invention is further exemplified by the following examples. These examples illustrate, but do not limit, the invention. All parts and percentages are by weight unless otherwise indicated. In the discussion above and in the examples below the term RH means relative humidity and the term VTR means vapor transmission rate.

EXAMPLES

Chemically cured polyimide films were prepared by casting samples of the copolyamic acid solutions on a Pyrex brand, room temperature glass substrate. The cast film was then immersed in for example a 1:1 by volume mixture of acetic anhydride and beta-picoline for form a gel film. The gel film floated free from the glass. The gel films were restrained on frames and thermally cured for 45 minutes at 300° C. and then for 5 minutes at 400° C.

As used herein the term "vapor transmission rate" (VTR) is a measure of the rate at which water, or another vapor, is released (transmitted) through a film. Typically, water is absorbed into a polyimide film from the inherent humidity in an ambient environment. In flexible circuitry manufacturing, polyimide metal laminates are formed. In 'directly deposited' metal deposition processes, water must first be removed from a polyimide film in order to prevent deforming the metal coating during deposition. The "water vapor transmission rate" of a polyimide film is measured in accordance with ASTM F-1249 (1995). The units of measure on VTR are grams of water released per day per square meter of film if the film where 1 millimeter thick (gram ($H_2O$)-mm/$m^2$-day). This is a calculated number based upon film thickness and water vapor transmission rate. See generally, *Permeability & Other Film Properties*, Plastics Design Library, NY (1995), particularly Table 117, 118, which is hereby incorporated by reference.

As used herein, the term "coefficient of hygroscopic expansion" or "coefficient of humidity expansion" (CHE) means the following. The CHE of the polyimide film was measured using a modified dilatometer. The film sample was a precision cut, 1 inch by 2½ inch, sample coiled into a ¼×1" diameter long coil. The coil was placed in a dessicator and dried overnight. The dilatometer piston was placed in a controlled humidity chamber whose humidity could be varied between 0% RH with dry nitrogen and about 75% RH with saturated sodium chloride solution. The dried sample was paced in the piston in a dry nitrogen atmosphere. The sample length was set on a recorder. The saturated salt solution was placed in the chamber and the sample length was allowed to expand until equilibrium was reached. The temperature and the % RH found for that temperature from a table of values for sodium chloride was noted. The CHE was calculated as the change in length divided by the change in humidity as a percentage of relative humidity.

Water absorption of polyimide films was determined by placing strips of film in distilled water for 48 hours at room temperature. The film samples were subsequently analyzed for water content by thermal gravimetric analysis, at 10° C./minute between the temperatures of 35° to 180° C.

Etch rates are determined by measuring the film thickness and then contacting one surface of the film with a caustic etchant consisting of 8.5 M KOH in water at 90° C. for less than 5 minutes. Afterwards the film surface can be rinsed with deionized water and then the film can be dried and remeasured for thickness. The loss in film thickness is then calculated in mils/min-side. The films of the present invention have consistent and predictable etch rates. The films of the present invention were found to have an adequate etch rate of about 0.6–0.8 mils/min both sides.

Examples 1 & 2

Copolymer was made containing 14 mole % BPDA and 86 mole % PMDA of the total dianhydride. The total diamine was composed of 21 mole % PPD and 79 mole % 3,4'-ODA. The polymer solution was 19.7 weight % in DMAc solvent with a solution viscosity of 2640 poise. The polymer was mixed with conversion chemicals and cast onto a substrate where it formed a gel film, then restrained and heated until dried and cured. Two thickness values of film were made. A high modulus was obtained as well as other necessary properties are described in the table below.

| Property | Example 1 | Example 2 |
|---|---|---|
| Average Thickness, mils | 2.06 | 1.58 |
| MD Modulus, kpsi | 1080 | 967 |
| TD Modulus, kpsi | 941 | 938 |
| MD CTE, ppm/° C. | 10.7 | 11.8 |
| TD CTE, ppm/° C. | 17.0 | 11.7 |
| MD CHE, ppm/% RH | 6.8 | 8.7 |
| TD CHE, ppm/% RH | 11.4 | 12.5 |
| Water Absorption, wt % | 1.8 | 1.9 |
| $H_2O$ VTR gm-mm/$m^2$-day | 0.43 | 0.46 |
| WVTR (for comparison) gm/$m^2$-day | 8.2 | 11.5 |

Examples 3 to 7

Polymer was made at room temperature by adding 3,4'-ODA, PPD, BPDA, and PMDA with stirring in DMAc in quantities to make polymers with compositions between 5 and 14 mole % BPDA and between 5 and 21 mole % PPD. The remaining monomers were PMDA as the dianhydride and 3,4'-ODA as the diamine. The polymers were each cast on a substrate and converted in a bath of 50 volume % acetic anhydride and 50 volume % beta-picoline, at room temperature, to form a gel film. The gel film was restrained and heated in an oven to dry and cure at 300° C. for 60 minutes, and then heated in 400° C. oven for 5 minutes. The properties were as follows:

| Examples | 3 | 4 | 5 | 6 | 7 |
|---|---|---|---|---|---|
| % BPDA | 5 | 5 | 9.5 | 14 | 14 |
| % PMDA | 95 | 95 | 90.5 | 86 | 86 |
| % PPD | 5 | 21 | 13 | 5 | 21 |
| % 3,4'-ODA | 95 | 79 | 87 | 95 | 79 |
| Modulus, kpsi cast direction | 903 | 1036 | 993 | 934 | 1036 |
| Modulus, kpsi, cross direction | 866 | 963 | 841 | 892 | 947 |
| CTE, ppm/° C., cast direction | 13.6 | 15.1 | 16.3 | 14.3 | 11.9 |
| CTE, ppm/° C., cross direction | 22.6 | 16.8 | 16.7 | 23.1 | 16.4 |
| % $H_2O$ Absorption | 2.6 | 2.3 | 2.5 | 2.3 | 2.3 |

Example 8 and Comparative Example 9

Examples 8 & 9 identify the differences between 3,4'-ODA (a crankshaft monomer) and 4,4'ODA (very similar, but not a non-crankshaft monomer) at the same mole percent loading. Example 8 was made using 3,4'-ODA while Example 9 was made at the same conditions, at the same mole ratios, but using 4,4'ODA instead of 3,4'-ODA. Example 8 was made with 15.0 g of 3,4'-ODA added to 120 cc of DMAc in a beaker at 40° C. and stirred. This was followed by 2.15 g of PPD rinsed in with 15 cc DMAc, then 3.91 g BPDA rinsed with 15 cc DMAc. 17.4 g PMDA rinsed in with 15 cc DMAc, and then 5.6 cc of a 6% PMDA solution in DMAc was added to form a polymer with a viscosity of 3561 poise and a solids content of 19.5 weight %. 100 g of this polymer was diluted with 10 cc of DMAC for improved casting and formed into a film on a glass plate using a coating bar with a 35 thousands of an inch gap. The polymer was converted at room temperature by submerging the coated plate into a bath containing 25% acetic anhydride, 25% beta-picoline, and 50% DMAc by volume. The resulting gel film was removed from the substrate and restrained and dried in a 300° C. oven over 45 minutes followed by putting into a 400° C. oven for 10 minutes. Example 9 was prepared in the same way as Example 8 except (1) 15.0 g of 4,4'-ODA was used instead of 3,4'-ODA, and (2) 3.1 cc of the 6% PMDA solution was needed to get a polymer viscosity of 2981 poise. The films made in Examples 8 and 9 were good films and were measured to have the following properties:

| Property | Example 8 (3,4'-ODA) | Example 9 (4,4'-ODA) |
|---|---|---|
| WVTR, gm/m²-day | 16.1 (1.8 mils) | 25.3 (1.6 mils) |
| VTR, gm*mm/m²-day | 0.73 | 1.03 |
| CHE, ppm/% RH | 23.4 | 14.9 |
| Modulus, kpsi | 680. | 290. |
| Tensile, kpsi | 21. | 23. |
| Elongation, % | 71. | 44. |
| CTE, ppm/° C. | 15.6 | 28.7 |
| Water absorption, wt. % | 2.4 | 2.2 |
| Tg, DMA, tan delta | 402 | 376 |

Example 8 with 3,4'-ODA has a higher modulus combined with a favorable CTE of 15.6 (near copper that has a CTE of about 17). A difference between the samples, a difference that is compelling, is the improvement in Tg of Example 8 when compared to Example 9. 3,4'-ODA yields a higher Tg at the same composition. Higher Tg allows the film to be processed at higher temperatures without distortion like shrinking. The glass transition temperature (Tg) is an easily measured property using a Dynamic Mechanical Analyzer.

Nothing in the above disclosure is intended to limit the scope of Applicant's invention. The scope of the present invention is defined solely by the following claims.

What is claimed is:

1. A substrate comprising:

a polyimide layer having a thickness in the range of from 2, 3, 4, 5, 7, 10, 12, 15, 17, or 20 microns to about 50, 100, 200, 250 or 500 microns, said polyimide layer comprising a polyimide base polymer, said polyimide base polymer being synthesized by contacting together in one or more steps a precursor composition comprising a diamine and a dianhydride, at least 70, 75, 80, 85, 90, 92, 94, 95, 96, 97, 98, 99 or 100 mole percent of the diamine being an aromatic crankshaft diamine and an aromatic collinear diamine, the aromatic crankshaft diamine to aromatic collinear diamine being in a mole ratio of about 60–95:5–40;

at least 70, 75, 80, 85, 90, 92, 94, 95, 96, 97, 98, 99 or 100 mole percent of the dianhydride being an aromatic crankshaft dianhydride and an aromatic collinear dianhydride, the aromatic crankshaft dianhydride and the aromatic collinear dianhydride being in a mole ratio of about 5–35:65–95, the diamine and dianhydride crankshaft components being either a non-rigid type crankshaft monomer or a rigid type crankshaft monomer whereby the mole ratio of non-rigid crankshaft monomer to rigid crankshaft monomer is A:B, where A is a range from 50, 55, 60, 65, 70, 75, or 80, to about 80, 85, 90, 92, 94, 95, 96, 97, 98, 99 or 100, and B is a range from 0, 1, 2, 3, 4, 5, 6, 8, 10, 15, or 20 to about 20, 25, 30, 25, 40, 45 or 50;

the precursor composition being cured to a tensile modulus greater than 700, 725, 750, 775 or 800 kpsi (at 20° C.) to provide the polyimide base polymer having the following properties:

a. a transmission rate of water vapor greater than about 0.3, 0.35, 04, 0.45, 0.5, 0.55, 0.6, 0.65, or 0.7 gram-mm/(m²-day), and b. a coefficient of linear thermal expansion of from 5–25 ppm/° C. measured between 50° C. and 250° C.

2. A substrate according to claim 1, wherein the polyimide layer is further characterized as having a coefficient of moisture-absorption expansion of less than or equal to 20, 19, 18, 17, or 16 ppm per % RH.

3. A substrate in accordance with claim 1 or 2 wherein the polyimide layer is further characterized as having a water absorption of less than or equal to 3.0% 2.8%, 2.5%, 2.3% or 2.0%.

4. A substrate in accordance with claim 1 or 2 wherein the polyimide layer is further characterized as having an etch rate greater than 0.1 mils/min.

5. A substrate in accordance with claim 1, the crankshaft monomer comprising a rigid type crankshaft monomer and a non-rigid type crankshaft monomer, wherein the mole ratio of non-rigid type crankshaft monomer to rigid type crankshaft monomer is A:B, where A is a range from 70, 75, or 80, to about 80, 85, 90, 92, 94, or 95, and B is a range from 5, 6, 8, 10, 15, or 20 to about 20, 25, or 30.

6. A substrate in accordance with claim 5, wherein the non-rigid type diamine crankshaft monomer comprises a bridging group between a first aromatic ring and a second aromatic ring, the bridging group comprising one or more members of the group consisting of: —O—, —N(H)—C(O)—, —S—, —SO$_2$—, —C(O)—, C(O)—O—, —C(CF$_3$)$_2$—, and —C(R,R')—, where R and R' are the same or different and are any organic group capable of bonding to a carbon.

7. A substrate in accordance with claim 5, wherein said polyimide base polymer has a glass transition temperature above 300, 330, 350, 360, 370, 380, 385, 390, 395, 400, 425, 450, 475, 500, 525, 550, 575, or 600° C.

8. A substrate in accordance with claim 1, wherein said polyimide layer has a modulus from 800–1200 kpsi.

9. A substrate in accordance with claim 1, wherein the aromatic crankshaft diamine comprises 3,4'-oxydianiline ("3,4'-ODA") or a functional derivative thereof.

10. A substrate in accordance with claim 1, wherein the aromatic crankshaft dianhydride comprises 3,3'4,4'-biphenyltetracarboxylic dianhydride ("BPDA") or a functional derivative thereof.

11. A substrate in accordance with claim 1, wherein the aromatic collinear diamine comprises p-phenylenediamine ("PPD") or a functional derivative thereof.

12. A substrate in accordance with claim 1, wherein the aromatic collinear dianhydride comprises pyromellitic dianhydride ("PMDA") or a functional derivative thereof.

13. A substrate in accordance with claim 1, wherein the aromatic crankshaft diamine comprises 3,4'-oxydianiline ("3,4'-ODA") or a functional derivative thereof, and the aromatic crankshaft dianhydride comprises 3,3'4,4'-biphenyltetracarboxylic dianhydride ("BPDA") or a functional derivative thereof.

14. A substrate in accordance with claim 13, wherein the aromatic collinear diamine comprises p-phenylenediamine ("PPD") or a functional derivative thereof.

15. A substrate in accordance with claim 13 or 14, wherein the aromatic collinear dianhydride comprises pyromellitic dianhydride ("PMDA") or a functional derivative thereof.

16. A substrate according to claim 1 further comprising an adhesive film said adhesive film comprising epoxy, cyanate, urethane, melamine, acrylic, phenolic, imide or a combination thereof.

17. A substrate in accordance with claim 1 further comprising a metal layer.

18. A substrate in accordance with claim 17 wherein the polyimide layer is coated onto the metal layer as a polyamic acid layer and then cured to a polyimide layer.

19. A substrate in accordance with claim 17, wherein the metal is vapor deposited or sputtered directly onto the polyimide layer.

20. A substrate in accordance with claim 19, wherein the metal is also electroplated to the substrate after sputtering or vapor depositing.

21. A substrate in accordance with claim 17, wherein the polyimide layer is bonded to the metal layer with an adhesive.

22. A substrate in accordance with claim 21, wherein the adhesive comprises one or more of the following functional groups: acrylic, imide, melamine, urethane, phenolic, cyanate and epoxy.

23. A substrate in accordance with claim 1, wherein the polyimide is derived in part by reacting:
   i. 3,4'-oxydianiline ("3,4'-ODA") or a functional derivative thereof;
   ii. p-phenylenediamine ("PPD") or a functional derivative thereof;
   iii. 3,3'4,4'-biphenyltetracarboxylic dianhydride ("BPDA") or a functional derivative thereof; and
   iv. pyromellitic dianhydride ("PMDA") or a functional derivative thereof,
wherein at least 90, 95, 97, 98 or 100 mole % of the polyimide polymer is synthesized from monomers i, ii, iii and iv.

24. A substrate in accordance with claim 23 wherein the mole ratio of monomer (i) to monomer (ii) is C:D where C is a range from 65, 70, 72 or 75 to 75, 78, 80, 85, 90, 92 or 95, and D is a range from 35, 30, 28 or 25 to 25, 22, 20, 15, 10, 8 or 5, and the mole ratio of monomer (iii) to monomer (iv.) is in the range of E:F, where E is a range from 5, 7, 10, or 12 to 12, 14, 18 or 20, and F is a range from 80, 82, 84, or 86 to 88, 90, 93 or 95.

25. A substrate in accordance with claim 24 further comprising a metal layer.

26. A substrate in accordance with claim 25 wherein the polyimide layer is coated onto the metal layer as a polyamic acid layer and then cured to a polyimide layer.

27. A substrate in accordance with claim 25 wherein the metal is first vapor metal deposited or sputtered directly onto the polyimide layer, and then electroplated thereon.

28. A substrate in accordance with claim 25, wherein the polyimide layer is bonded to the metal layer with an adhesive.

29. A substrate in accordance with claim 26, wherein the adhesive comprises one or more of the following functional groups: acrylic, imide, melamine, urethane, phenolic, cyanate, and epoxy.

30. A substrate in accordance with claim 1, wherein at least one face of said polyimide layer is subjected to at least one treatment comprising at least on of the following processes: heating, crosslinking with a crosslink additive, subjecting to a corona discharge, subjecting to a plasma field, adding an oligomer or adding a coupling agent.

31. A process for manufacturing a polyimide film, comprising: creating an amic acid solution in an organic solvent comprising a reaction product of components comprising at least:
   i. 3,4'-oxydianiline ("3,4'-ODA") or a functional derivative thereof;
   ii. p-phenylenediamine ("PPD") or a functional derivative thereof;
   iii. 3,3'4,4'-biphenyltetracarboxylic dianhydride ("BPDA") or a functional derivative thereof; and
   iv. pyromellitic dianhydride ("PMDA") or a functional derivative thereof,
wherein at least 95 mole % of the polyimide polymer is synthesized from the above four monomers and the mole ratio of monomer (i) to monomer (ii) is in the range of 65–95:35–5, and the mole ratio of monomer (iii) to monomer (iv) is in the range of 5–20:80–95, and wherein the amic acid solution is synthesized at least in part by:
   a) combining and polymerizing at least monomers i., ii., iii., and iv
   b) mixing the composition of (a.) with a dehydrating agent and a catalyst,
   c) applying the composition of (b.) to a support to give a film, and
   d) converting the composition of (c.) to an imide film by heating above 250, 300, 350, 400, 450, 500 or 550° C.

32. A process according to claim 31, wherein step (a.) is performed by creating a first polyamic acid with an excessive of diamine components and creating a second polyamic acid with an excessive of dianhydride components, and then reacting said first polyamic acid and said second polyamic acids together to form a non-random or block copolymer.

33. A process according to claim 31, wherein the diamine components and the dianhydride components are preliminarily mixed together and then the mixture is added in portions to a solvent while stirring.

34. A process according to claim 31, wherein a solvent is added to a mixture of the diamine and the dianhydride components.

35. A process according to claim 31, wherein the diamines are first dissolved in a solvent and then the dianhydride is added thereto.

36. A process according to claim 31, wherein the dianhydride components are dissolved in a solvent and then the diamine components are added thereto.

37. A process according to claim 31, wherein the diamine components and the dianhydride components are separately dissolved in solvents and then are mixed.

38. A process according to claim 31, wherein the polyamic acid comprises a first polyamic acid solution with an excess of diamine component and a second polyamic acid solution having an excess of dianhydride component, the first and second polyamic acid solutions being preliminarily formed and then reacted with each other to create a non-random or block copolymer.

39. A process according to claim 31, wherein a proportion of the diamine component and the dianhydride components are first reacted together, and then an additional amount of diamine or dianhydride component is added.

40. A process according to claim 31, wherein the conversion chemicals are mixed with the polyamic acid to form a polyamic acid casting solution that is then cast to form a gel film.

41. A process according to claim 31, wherein the polyamic acid components are added together in multiple steps to form a non-random block copolymer.

42. A substrate in accordance with claim 1, wherein the substrate is modified to provide a high density package from the group consisting of: a chip on lead ("COL") package, chip on flex ("COF"), a lead on chip ("LOC") package, a multi-chip module ("MCM"), a ball grid array ("BGA" or "$\mu$-BGA") package, chip scale package ("CSP") and a tape automated bonding ("TAB") package.

43. A substrate according to claim 42, wherein the substrate defines a package for a semiconductor device, said semiconductor device comprising gallium arsenide.

44. A wafer level integrated circuit packaging composite comprising:

(i) a substrate in accordance with claim 1, (ii) a conductive layer having a thickness of less than 100 microns, and (iii) a wafer comprising a plurality of integrated circuit dies.

45. A composite in accordance with claim 44, further comprising a conductive passageway, said passageway comprising one or more of the following group: a wire bond, a conductive metal, and a solder bump.

46. A composite in accordance with claim 45 further comprising an adhesive layer.

* * * * *